United States Patent [19]
Shichinohe

[11] Patent Number: 5,298,804
[45] Date of Patent: Mar. 29, 1994

[54] OUTPUT CIRCUIT WHICH SURPRESSES RINGING

[75] Inventor: Daisuke Shichinohe, Itami, Japan

[73] Assignee: Mitsubishi Denki Kabushiki Kaisha, Tokyo, Japan

[21] Appl. No.: 788,275

[22] Filed: Nov. 5, 1991

[30] Foreign Application Priority Data

Apr. 17, 1991 [JP] Japan .................. 3-085165

[51] Int. Cl.⁵ .................. H03K 19/092; H03K 19/094
[52] U.S. Cl. ..................................... 307/475; 307/270; 307/451; 307/448
[58] Field of Search ............... 307/475, 270, 451, 448

[56] References Cited

U.S. PATENT DOCUMENTS

| | | | |
|---|---|---|---|
| 4,096,398 | 6/1978 | Khaitan | 307/270 |
| 4,365,172 | 12/1982 | Prater | 307/270 |
| 4,565,932 | 1/1986 | Kuo et al. | 307/270 |
| 4,641,046 | 2/1987 | Becker et al. | 307/448 |
| 4,701,635 | 10/1987 | Kawazoe et al. | 307/270 |
| 4,754,170 | 6/1988 | Toda et al. | 307/448 |
| 4,958,089 | 9/1990 | Fitzpatrick et al. | 307/448 |
| 4,963,765 | 10/1990 | Kadakia et al. | 307/451 |
| 4,985,644 | 1/1991 | Okihara et al. | 307/443 |
| 5,065,361 | 11/1991 | Yoshizawa et al. | 307/475 |
| 5,111,064 | 5/1992 | Ward | 307/270 |

FOREIGN PATENT DOCUMENTS 63-283315  11/1988  Japan .

Primary Examiner—Edward P. Westin
Assistant Examiner—Richard Roseen
Attorney, Agent, or Firm—Oblon, Spivak, McClelland, Maier & Neustadt

[57] ABSTRACT

An output circuit K11 including a transistor 1N controlled by the logical level of an input terminal 11 and transistor 2N controlled by the logical level of an output terminal 12 is connected to an output circuit K22 including an inverter 1G and a transmission gate composed of transistors 3N and 4P, in parallel between power sources $V_{DD}$ and $V_{SS}$. When an output potential $V_O$ is around the potential $V_{DD}$, the output circuit K11 having a large current drive capability drives an output current $I_O$. When the output potential $V_O$ is around the potential $V_{SS}$, the output circuit K22 having a large on resistance drives the output current $I_O$.

17 Claims, 15 Drawing Sheets

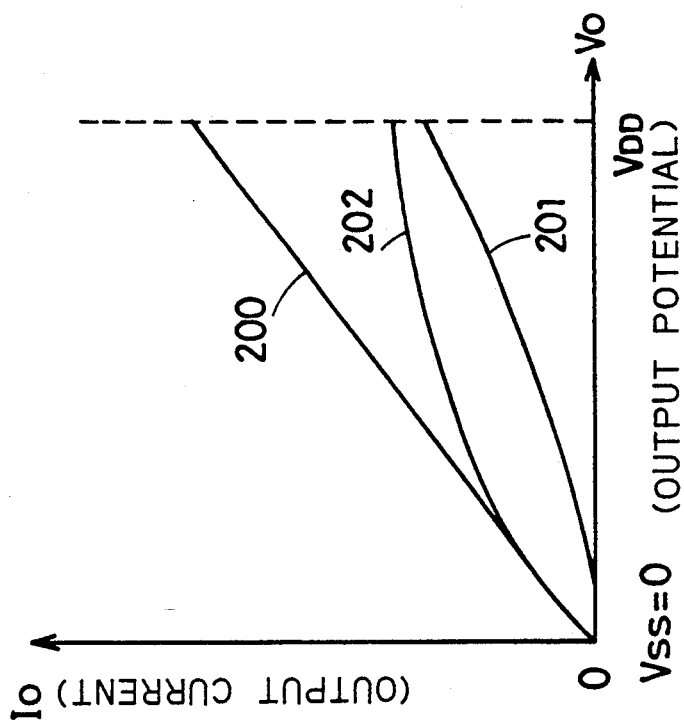
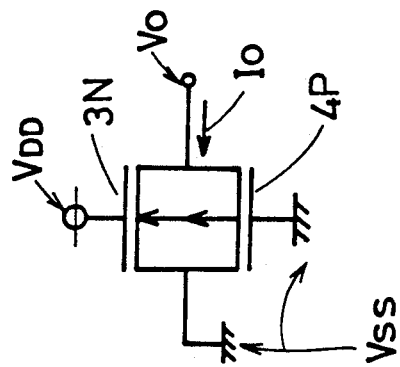
FIG. 3a
FIG. 3b

OUTPUT CIRCUIT WHICH SUPPRESSES RINGING

BACKGROUND OF THE INVENTION

Field of the Invention

The present invention relates to an output circuit which suppresses ringing in an output voltage waveform and reflection at a termination.

Description of the Background Art

Recently, a logic circuit is required to operate at a higher speed in order to meet demands for high-speed processing of digital data. Accordingly, it is necessary to drive a load having a large capacitance at a high speed in an output circuit.

The output circuit which is made to work faster by the connection of the load having the large capacitance operates a resonance circuit composed of a load capacitance and an inductance such as wiring, so that ringing occurs in an output waveform.

With the faster operation, the necessity arises to take the load not only as a lumped constant device having simpler inductance and capacitance but also as a distributed constant device. For example, wiring on a multilayer circuit board must be treated as the distributed constant device such as a microstrip line.

Described below is the high-speed operation of a conventional output circuit shown in FIG. 14. Reference characters 1N and 1P designate N-channel and P-channel transistors, respectively. The transistors 1N and 1P are driven complementarily, depending on the logical level of an input terminal 11 connected to the gates of the transistors 1N and 1P in common. When the logical level of the input terminal 11 is "H", the transistor 1N is driven while the transistor 1P is not, and the logical level of an output terminal 12 is "L". Similarly, when the logical level of the input terminal 11 is "L", the logical level of the output terminal 12 is the opposite of that of the input terminal 11.

For high-speed operation of the output circuit thus structured, the current drive capabilities of the transistors 1P and 1N should be enhanced, for example, by increasing the ratio of the channel width to the channel length in the transistors 1P and 1N.

However, the enhancement of the current drive capabilities of the transistors 1P and 1N may cause ringing in the output waveform, depending on the load connected to the output terminal 12. FIG. 15 shows a simply modelled equivalent circuit including the load to be driven, in which the transistor 1P is off (not driven) and the transistor 1N is on (driven). In this case, the output terminal 12 outputs the logical level "L". The transistor 1N, which is on, is represented by the parallel connection of a current source CS and an on resistance $R_{ON}$. A capacitance 32 (having a capacitance value C) as a load is connected to the output terminal 12. A parasitic inductance 31 (having an inductance value L) resulting from wiring of copper foil on a printed circuit board, bonding wires of an integrated circuit, lead frames of an IC and the like is interposed between the output terminal 12 and the capacitance 32. Hence, the output circuit and the load form an LCR resonance circuit.

When the current drive capability of the transistor 1N is large, the on resistance $R_{ON}$ is small and the Q value calculated from the formula (1) is high.

$$Q = \frac{j\omega_0 L}{R_{ON}} \quad (1)$$

where $$\omega_0 = 2\pi f_0$$

$$f_0 = \frac{1}{2\pi \sqrt{LC}} \quad (f_0: \text{resonance frequency})$$

The LCR resonance circuit is liable to resonate in response to the on/off change of the transistor 1N. The ringing (or undershoot US) is liable to occur at the fall time in the output waveform of the output terminal 12, as shown in FIG. 16.

In response to the on/off change of the transistor 1P, the ringing (or overshoot OS) is liable to occur at the rise time in the output waveform of the output terminal 12 for the same reason, as shown in FIG. 16.

The conventional output circuit structured as shown in FIG. 14 has a problem in that the ringing occurs in the output waveform when the current drive capabilities of the transistors 1P and 1N are enhanced for high-speed operation.

The ringing in the output waveform is sometimes caused by impedance mismatching when the load must be treated as the distributed constant device such as a transmission line. In this case, the ringing becomes noises in the transmission line to cause the malfunction of a logical circuit system and the jamming known as an undesired radiation to other electronic equipments.

To solve the problems, various measures have been taken, for example, by interposing a damping resistance in series between the output terminal 12 and the parasitic inductance 31 or by slowing a change in the logical level of the input terminal 11 to make difficult the resonance of the LCR resonance circuit shown equivalently in FIG. 15 (known as through-rate control). These measures, however, are not preferable for the faster operation of the output circuit.

SUMMARY OF THE INVENTION

According to the present invention, an output circuit comprises an input terminal for receiving an input signal, an output terminal for outputting an output signal, and a first output drive circuit connected between the output terminal and a first power source having a first logical level and controlled by the input signal for deriving the output signal having a logical level corresponding to the input signal from the output terminal, wherein a first change in the level of the output signal outputted from the output terminal is made from a second logical level to the first logical level, the first output drive circuit having a current drive capability of relatively large dependence on the first change in a region in which the level of the output signal is around the second logical level, and a current drive capability of relatively small dependence on the first change in a region in which the level of the output signal is around the first logical level, the current drive capability of the output circuit being decreased monotonically with the first change.

According to the present invention, as the level of the output signal changes from the second logical level to the first logical level, the dependence of the current drive capability of the first output drive circuit on the change in the output signal decreases. The on resistance around the second logical level is small, while the on resistance around the first logical level is large.

The current drive capability around the second logical level does not largely lowered. When the level of the output signal changes from the second logical level to the first logical level, the change in the output signal around the second logical level is made rapid, and the change in the output signal around the first logical level is made slow by increasing the on resistance.

An object of the present invention is to provide an output circuit capable of driving a load having a large capacitance at a high speed while suppressing ringing in an output waveform.

These and other objects, features, aspects and advantages of the present invention will become more apparent from the following detailed description of the present invention when taken in conjunction with the accompanying drawings.

BRIEF DESCRIPTION OF THE DRAWINGS

FIG. 3 illustrates the operation of a transmission gate;

DESCRIPTION OF THE PREFERRED EMBODIMENTS

Figure 1:
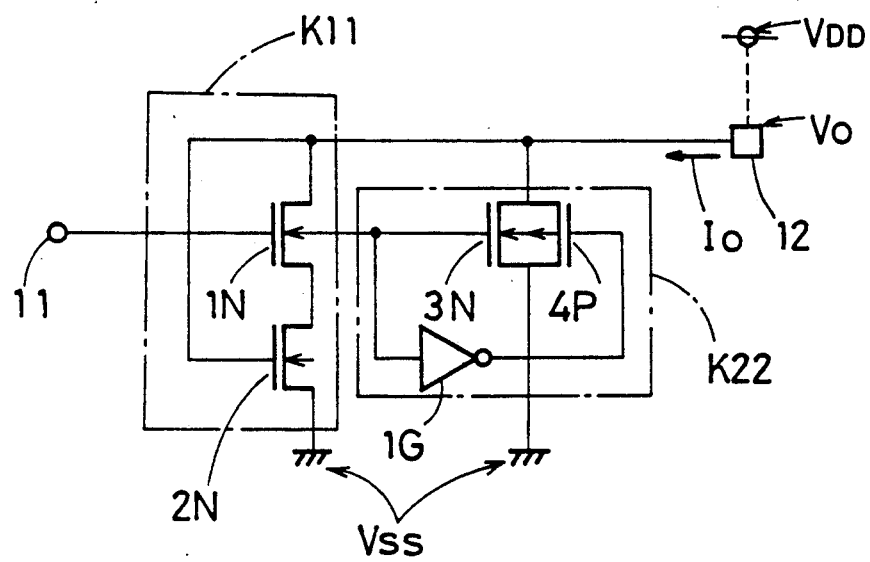
FIG. 1 is a circuit diagram of a first preferred embodiment according to the present invention.

FIG. 1 is a circuit diagram of an output circuit according to a first preferred embodiment of the present invention. This output circuit is what is called an open drain circuit. It is generally accepted to connect an output terminal 12 through a resistor to a power source $V_{DD}$ having a potential $V_{DD}$ corresponding to a logical level "H". For the purpose of simplification, the resistor is omitted in the output circuit. Output circuits K11 and K22 are connected in parallel between the output terminal 12 and a power source $V_{SS}$ (which is the ground, herein). The output circuits K11 and K22 are connected to an input terminal 11 in common.

The output circuit K11 includes N channel MOS transistors 1N and 2N. The gate of the transistor 1N is connected to the input terminal The source of the transistor 2N is connected to the power source $V_{SS}$. The drain thereof is connected to the source of the transistor 1N. The gate thereof is connected to the output terminal 12 and to the drain of the transistor 1N.

The output circuit K22 includes an inverter 1G, an N channel MOS transistor 3N and a P channel MOS transistor 4P.

The input portion of the inverter 1G is connected to the input terminal 11. The gate of the transistor 3N is connected to the input terminal 11. The source thereof is connected to the power source $V_{SS}$. The drain thereof is connected to the output terminal 12. The gate of the transistor 4P is connected to the output portion of the inverter 1G. The source thereof is connected to the output terminal 12. The drain thereof is connected to the power source $V_{SS}$. The transistors 3N and 4P constitute what is called a transmission gate.

Prior to the description of the operation of the first preferred embodiment, the operation of the output circuits K11 and K22 will be discussed hereinafter.

In the output circuit K11, the transistor 1N is off when the potential of the output terminal is equal to that of the power source $V_{SS}$ (hereinafter referred to as a "potential $V_{SS}$", which is 0 V herein) or at the logical level "L". Even if the drain of the transistor 1N is at a potential $V_{DD}$ corresponding to the logical level "H" and the transistor 2N is on, the transistor 1N is off, so that no current flows in the output circuit K11.

Figure 2:
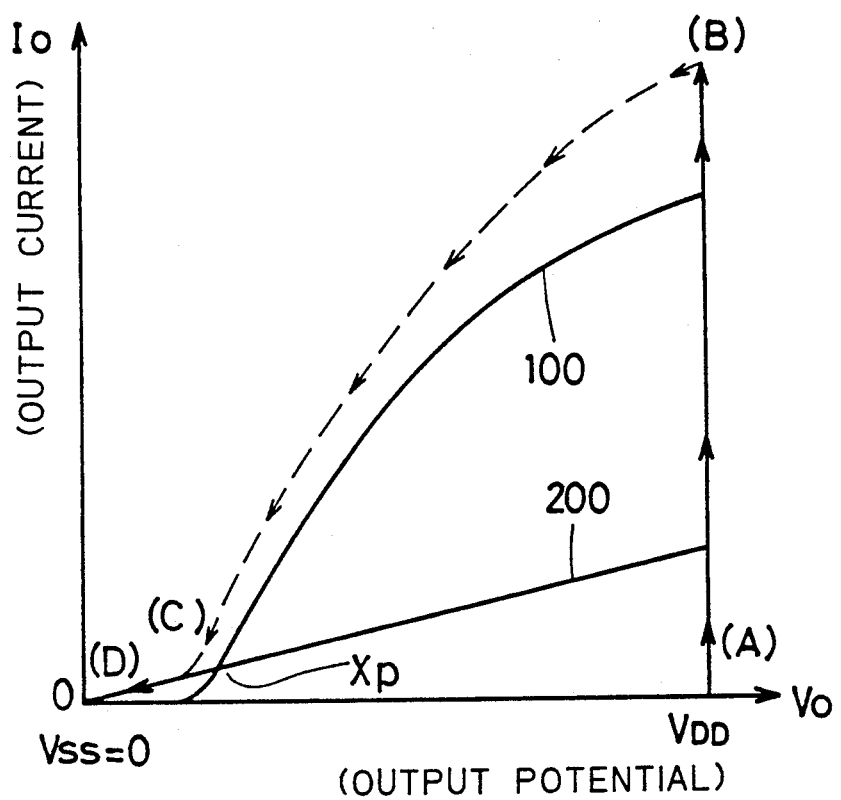
FIG. 2 illustrates the operation of the first preferred embodiment.

When the potential of the input terminal 11 rises to the potential $V_{DD}$, the transistor 1N turns on. Current flows through the transistors 1N and 2N, and the potential of the output terminal 12 (hereinafter referred to as an "output potential $V_O$") drops gradually. Accordingly, the gate potential of the transistor 2N drops gradually until the transistor 2N turns off at a threshold level or below. Since the transistor 2N is off while the transistor 1N is on, the current drive capability of the output circuit K11 decreases abruptly. A curve 100 in FIG. 2 shows such change in the current drive capability.

In the output circuit K22, the current drive capabilities of the transistors 3N and 4P which constitute the transmission gate are designed to be lower than those of the transistors 1N and 2N. The inverter 1G transmits the potential of the input terminal 11 complementarily to the transistors 3N and 4P. The output circuit K22 acts as a resistor when the potential of the input terminal 11 is at the logical level "H", and acts as an insulator when the potential thereof is at the logical level "L". Hence, the current drive capability of the output circuit K22 is approximately proportional to the output potential $V_O$, as shown by a line 200 in FIG. 2.

When the output potential $V_O$ is around the potential $V_{DD}$, the current drive capability of the output circuit K22 is lower than that of the output circuit K11. When the output potential $V_O$ is around the potential $V_{SS}$, the current drive capability of the output circuit K22 is higher than that of the output circuit K11, and an on resistance $R_{ON}$ increases. This is indicated by the presence of the intersection $X_P$ of the curve 100 and the line 200.

Hereinafter described is the operation of the output circuit of FIG. 1 in sequential order.

At the logical level "L" of the input terminal 11, the transistors 1N, 3N and 4P are off, and the output terminal 12 is at the logical level "H" (at the potential $V_{DD}$). There is no current flowing through the output circuits K11 and K22. The output potential $V_O$ is held at the potential $V_{DD}$ (in the region (A) of FIG. 2).

When the logical level of the input terminal 11 changes from "L" to "H", the transistors 1N, 3N and 4P in turn on immediately. At this time, the output potential $V_O$ is equal to the potential $V_{DD}$, and the transistor 2N is on. In the output circuit of FIG. 1, both of the output circuits K11 and K22 are on. An output current $I_O$ flowing out from the output terminal 12 increases abruptly from the region (A) to the region (B) of FIG. 2, so that the output potential $V_O$ is reduced with a large current drive capability (from the region (B) to the region (C)).

When the output potential $V_O$ provides access to the threshold voltage of the transistor 2N, the transistor 2N quickly turns off. From the region (C) to the region (D), only the output circuit K22 including the transistors 3N and 4P practically drives the output current $I_O$. Thus, the on resistance $R_{ON}$ of the output circuit is substantially determined only by the output circuit K22. The on resistance $R_{ON}$ is prevented from decreasing excessively, so that the generation of ringing is suppressed in the output voltage waveform of the output terminal 12.

In the output circuit K22 the complementary characteristics of the transistors 3N and 4P permit the on resistance $R_{ON}$ to appear substantially at the same level regardless of the level of the output potential $V_O$. At the logical level "H" of the output terminal 11, the potential $V_{DD}$ is applied to the gate of the transistor 3N, and the potential $V_{SS}$ is applied to the gate of the transistor 4P by the function of the inverter 1G. FIG. 3 shows the transistors 3N and 4P and their vicinities in the output circuit. A potential difference applied between the source and drain of the transistor 3N is equal to the output potential $V_O$ because $V_{SS}=0$. A part of the output current $I_O$ distributed to the transistor 3N decreases monotonically with the decrease in the output potential $V_O$, as shown by a curve 202. However, the amount of the change in the output current $I_O$ distributed to the transistor 3N, that is, the slope of the curve 202 increases.

A potential difference equal to the output potential $V_O$ is applied between the source and drain of the transistor 4P. The slope of another part of the output current $I_O$ distributed to the transistor 4P decreases with the decrease in the output potential $V_O$, as shown by a curve 201. Hence, the total output current $I_O$ is approximately proportional to the output potential $V_O$, so that the on resistance $R_{ON}$ of the transmission gate changes very little.

The on resistance $R_{ON}$ of the output circuit can be considered as the reciprocal of the slope of the curve indicative of the current drive capability in relation to the output potential $V_O$, that is, indicative of the output current $I_O$. An on resistance $R_1$ of the output circuit having the current drive capability indicated by the curve 101 of FIG. 4 can be considered as the reciprocal of a slope 103 in a region in which the output potential $V_O$ is around the potential $V_{SS}$.

Figure 4:
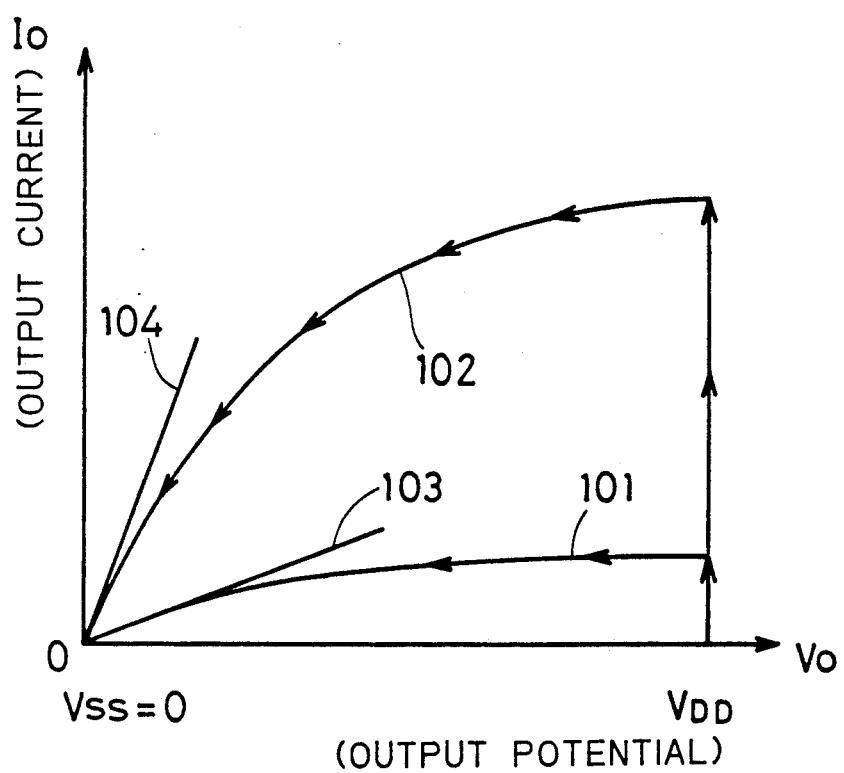
FIG. 4 shows a relationship between an on resistance and a current drive capability.
Figure 14:
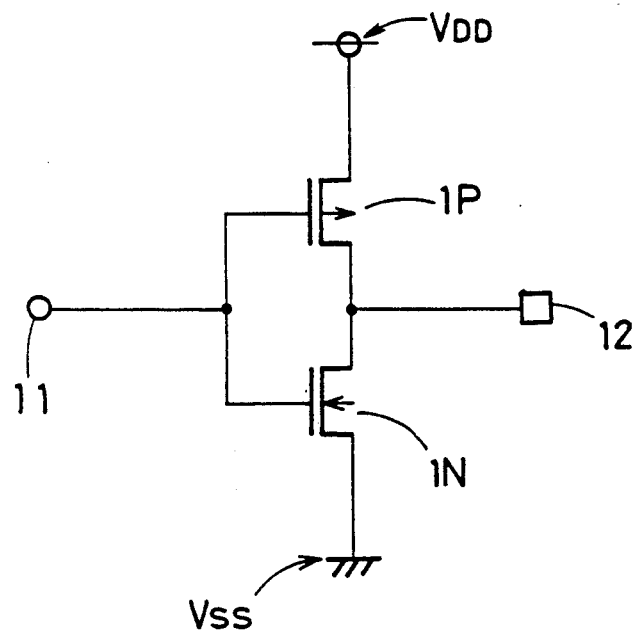
FIG. 14 is a circuit diagram of a conventional output circuit.
Figure 15:
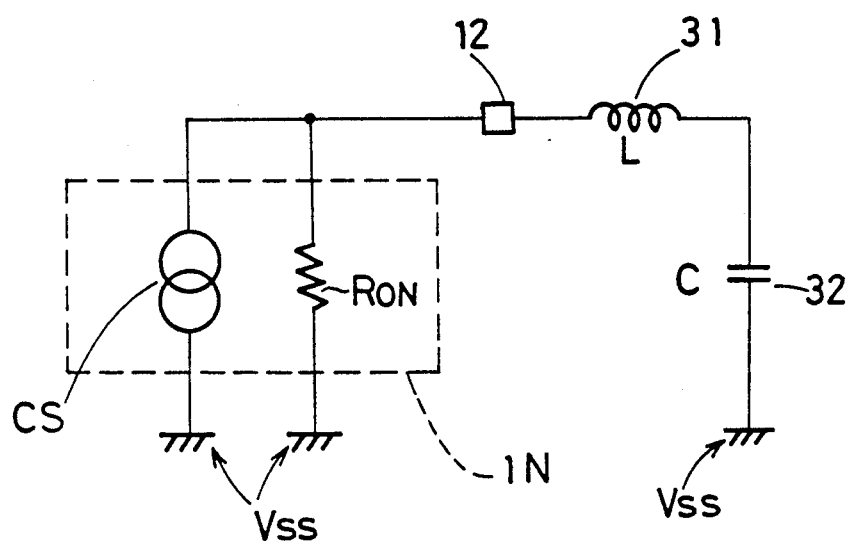
FIG. 15 is an equivalent circuit diagram in which a load is connected to the output circuit.
Figure 16:
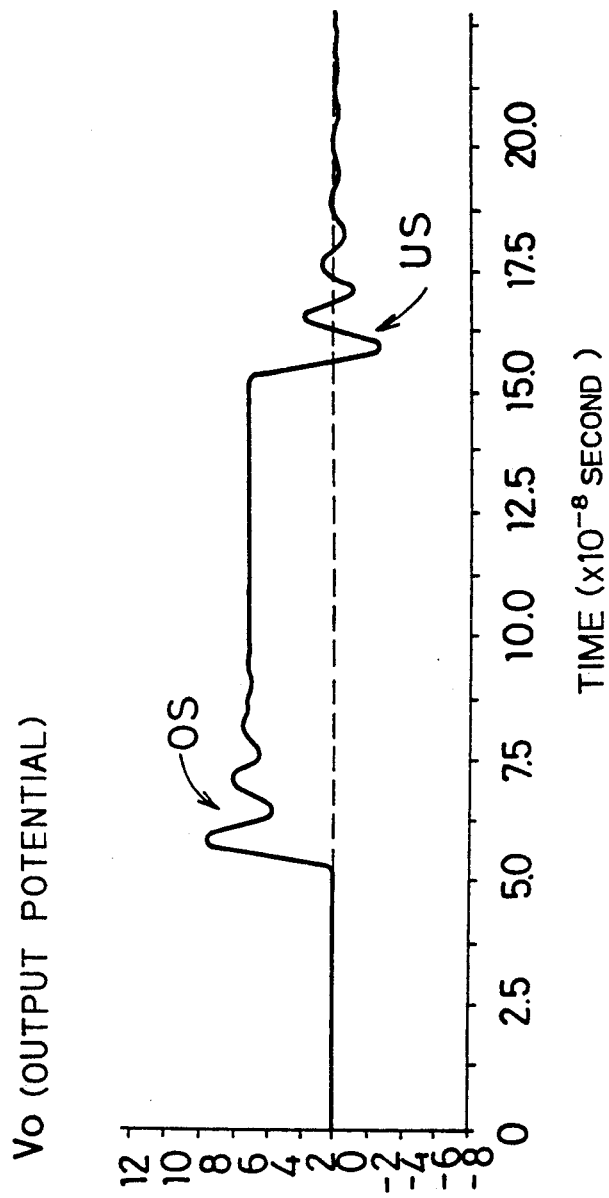
FIG. 16 is an output waveform chart of the conventional output circuit.

In general, the current drive capability of an N channel MOS transistor decreases abruptly as the potential difference between source and drain decreases. If the total current drive capability of the conventional output circuit shown in FIG. 14 is enhanced, the slope 104 of a curve 102 indicative of the characteristic of the N channel MOS transistor in FIG. 4 is steeper than the slope 103 of the curve 101.

That is, an on resistance $R_2$ of the N channel MOS transistor decreases, so that ringing is liable to occur. In the beginning of the change in the output potential $V_O$ from the potential $V_{DD}$ to the potential $V_{SS}$ (i.e., where the output potential $V_O$ is around the potential $V_{DD}$) in the first preferred embodiment shown in FIG. 1, the output current $I_O$ flows with a curent drive capability of relatively large dependence on the change in the output potential $V_O$. In the end of the change (i.e., where the output potential $V_O$ is around the potential $V_{SS}$), the output current $I_O$ flows with a current drive capability of relatively small dependence on the change. Hence, ringing can be suppressed without the deterioration of the fall time in the waveform. In order to achieve such a current drive capability, the present invention comprises two output circuits connected in parallel, that is, a first output circuit (the output circuit K11 in the first preferred embodiment) having a current drive capability decreasing monotonically at a relatively large decrease rate, and a second output circuit (the output circuit K22 in the first preferred embodiment) having a current drive capability decreasing monotonically at a relatively small decrease rate.

The second output circuit may be an output circuit having the aforesaid current drive capability such as a transistor having a high on resistance. The second output circuit which constitutes a transmission gate, e.g., the output circuit K22 in the first preferred embodiment is more preferable in terms of impedance matching.

Figure 5:
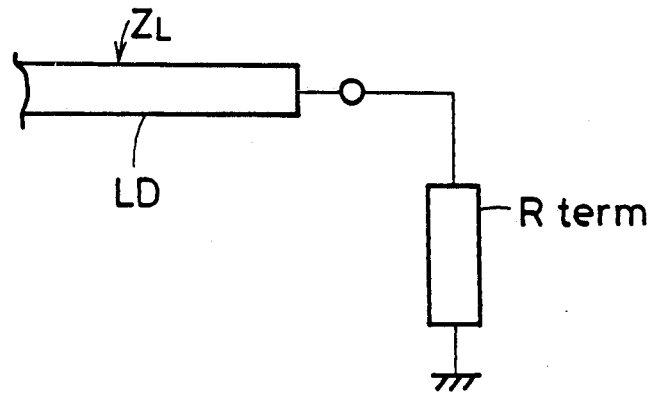
FIG. 5 illustrates a reflection coefficient.

When the load connected to the output circuit is a distributed constant device such as a transmission line, the impedance matching between the load and the output circuit becomes a problem. FIG. 5 shows connection of a load LD to the output circuit, where the on resistance is considered as a termination resistance $R_{term}$. When the load LD has a characteristic impedance $Z_L$, a reflection coefficient $\rho$ in the output circuit is expressed as:

$$\rho = \frac{R_{term} - Z_L}{R_{term} + Z_L} \quad (2)$$

In general, the absolute value of the reflection coefficient $\rho$ is preferably around ⅓ or less. It is found from the formula (3) that the on resistance $R_{term}$ of the output circuit which satisfies this condition is one-half to twice the characteristic impedance $Z_L$.

$$\left| \frac{R_{term} - Z_L}{R_{term} + Z_L} \right| < \frac{1}{3} \quad (3)$$

By the use of the transmission gate having the current drive capability of excellent linearity in relation to the output potential $V_O$, an output circuit can be easily structured which has the on resistance corresponding to the characteristic impedance $Z_L$ of the load LD and satisfying the aforesaid condition.

Figure 6:
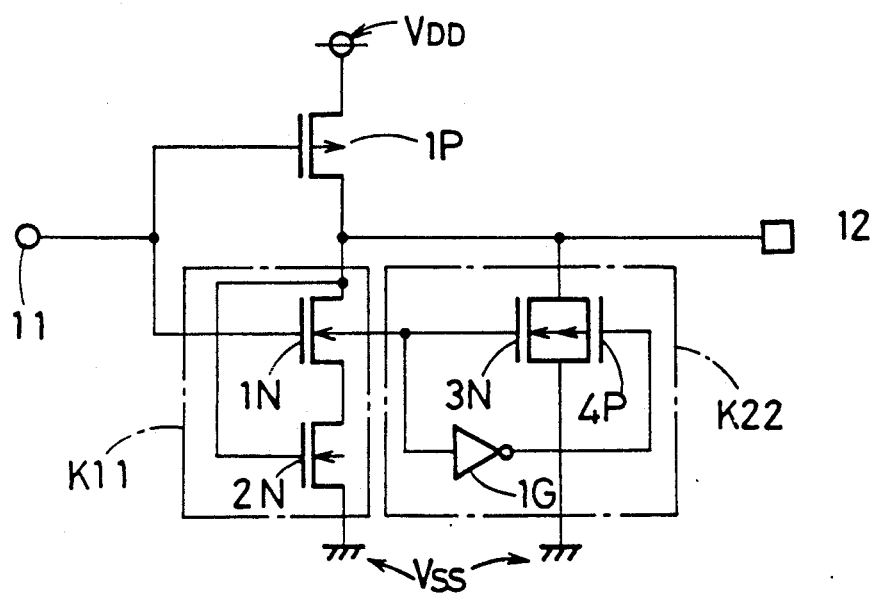
FIG. 6 is a circuit diagram of a second preferred embodiment according to the present invention.

The open drain circuit of FIG. 1 is discussed in the first preferred embodiment. According to a second preferred embodiment of the present invention, a P channel MOS transistor 1P is provided between the power source $V_{DD}$ and the output terminal 12 as shown in FIG. 6. In the second preferred embodiment, the ringing generated when the output potential $V_O$ changes from the logical level "H" to the logical level "L" can be suppressed similarly to the first preferred embodiment. However, the ringing generated when the output potential $V_O$ changes from the logical level "L"

to the logical level "H" cannot be suppressed similarly to the conventional output circuit of FIG. 14.

Figure 7:
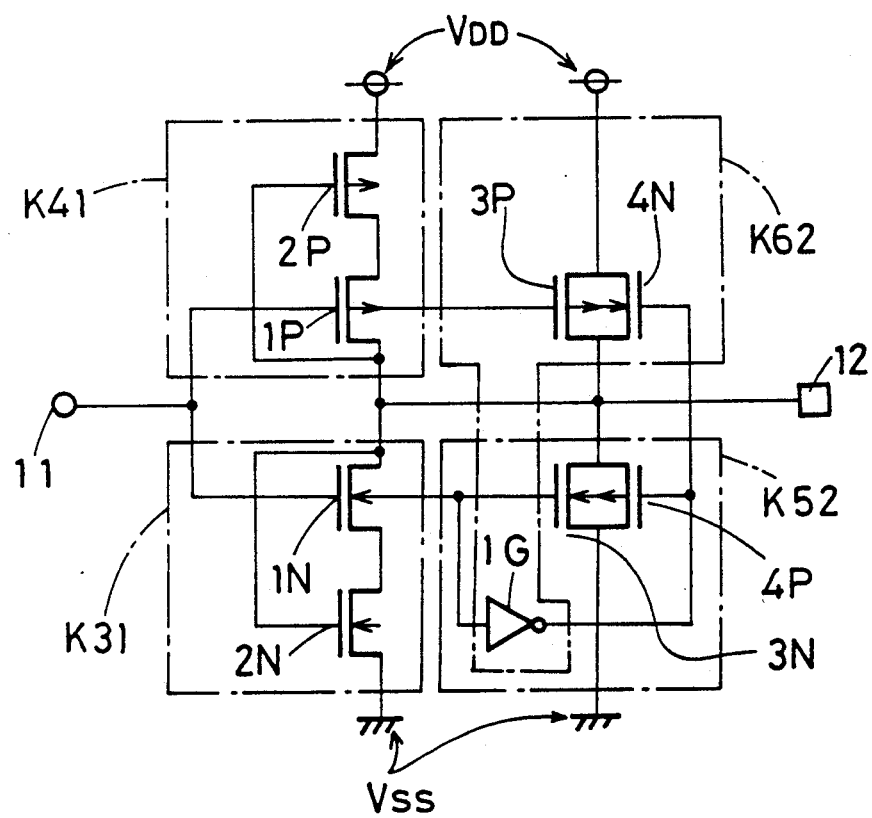
FIG. 7 is a circuit diagram of a third preferred embodiment according to the present invention.

FIG. 7 shows an output circuit according to a third preferred embodiment which can suppress the ringing in the output waveform generated by the changes in the logical level in either direction. Output circuits K31 and K41 are connected in series between the power sources $V_{DD}$ and $V_{SS}$. Output circuits K52 and K62 are connected in series between the power sources $V_{DD}$ and $V_{SS}$. The output circuits K31, K41, K52 and K62 are connected in common to the output terminal 12. The output circuits K31 and K52 are equivalent to the output circuits K11 and K22 of the first and second preferred embodiments, respectively.

The output circuits K41 and K31 are formed complementarily, and the output circuits K62 and K52 are formed complementarily. The output circuit K41 includes P channel MOS transistors 1P and 2P. The gate of the transistor 1P is connected to the input terminal 11. The source of the transistor 2P is connected to the power source $V_{DD}$. The drain thereof is connected to the source of the transistor 1P. The gate thereof is connected to the output terminal 12 and to the drain of the transistor 1P. The output circuit KG2 includes an inverter 1G, a P channel MOS transistor 3P and an N channel MOS transistor 4N. The input portion Of the inverter 1G is connected to the input terminal 11. The gate, source, and drain of the transistor 3P are connected to the input terminal 11, the power source $V_{DD}$, and the output terminal 12, respectively. The gate, source, and drain of the transistor 4N are connected to the output portion of the inverter 1G, the output terminal 12, and the power source $V_{DD}$, respectively. The transistors 3P and 4N constitute what is called a transmission gate. The output circuit K62 shares the inverter 1G with the output circuit K52.

The output circuits K41 and K62 operate complementarily to the Output circuits K31 and K52, respectively.

When the input terminal 11 is at the potential $V_{DD}$ (at the logical level "H"), the output potential $V_O$ is equal to the potential $V_{SS}$ (at the logical level "L") because the output circuits K31 and K52 are on, and the transistor 2P is on. Since the transistor 1P is off, no current flows in the output circuit K41, so that the output potential $V_O$ is held at the potential $V_{SS}$.

When the potential of the input terminal 11 drops to the potential $V_{SS}$ (at the logical level "L"), the output circuits K31 and K52 turn off immediately. The output potential $V_O$ is determined by the operations of the output circuits K41 and K62.

Figure 8:
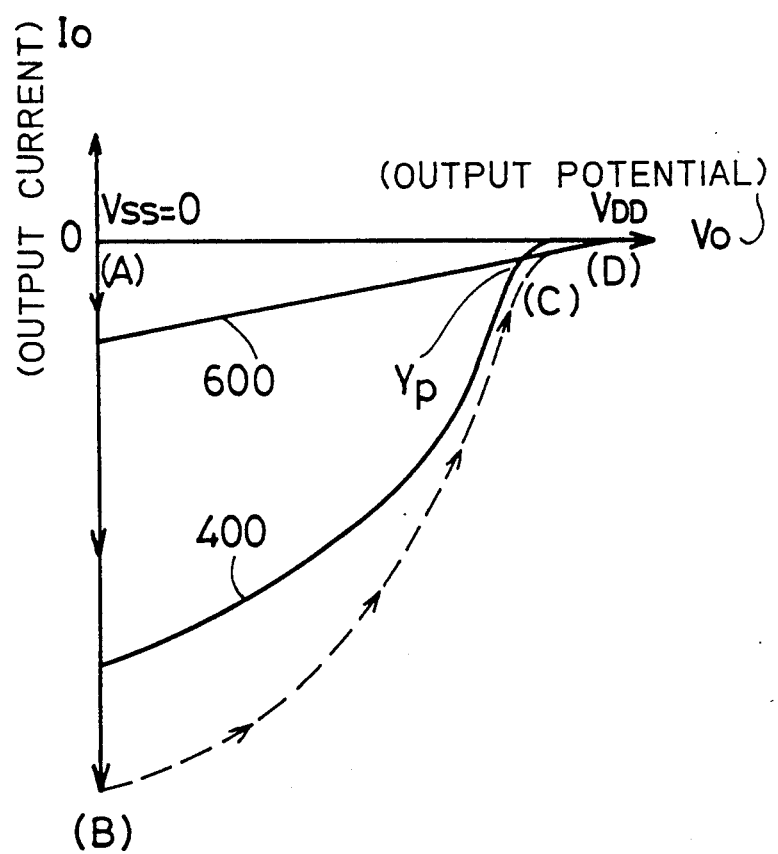
FIG. 8 illustrates the operation of the third preferred embodiment.

The current drive capability of the output circuit K41 at this time is shown by a curve 400 in FIG. 8. In the beginning of change in the output potential $V_O$ from the potential $V_{SS}$ to the potential $V_{DD}$ (from the region (A) to the region (B)), the current drive capability is large. When the output potential $V_O$ exceeds the threshold level of the transistor 2P, the transistor 2P turns off, so that the current drive capability decreases abruptly (in the region (C)).

The current drive capability of the output circuit K62 changes linearly in relation to the output potential $V_O$ (as shown by a line 600 in FIG. 8), similarly to that of the output circuit K22. When the output potential $V_O$ is around the potential $V_{SS}$, the current drive capability of the output circuit K62 is lower than that of the output circuit K41. When the output potential $V_O$ is around the potential $V_{DD}$, the current drive capability of the output circuit K62 is higher than that of the output circuit K41, and the on resistance $R_{ON}$ of the output circuit K62 increases. This is indicated by the presence of the intersection $Y_P$ of the curve 400 and the line 600.

Figure 9:
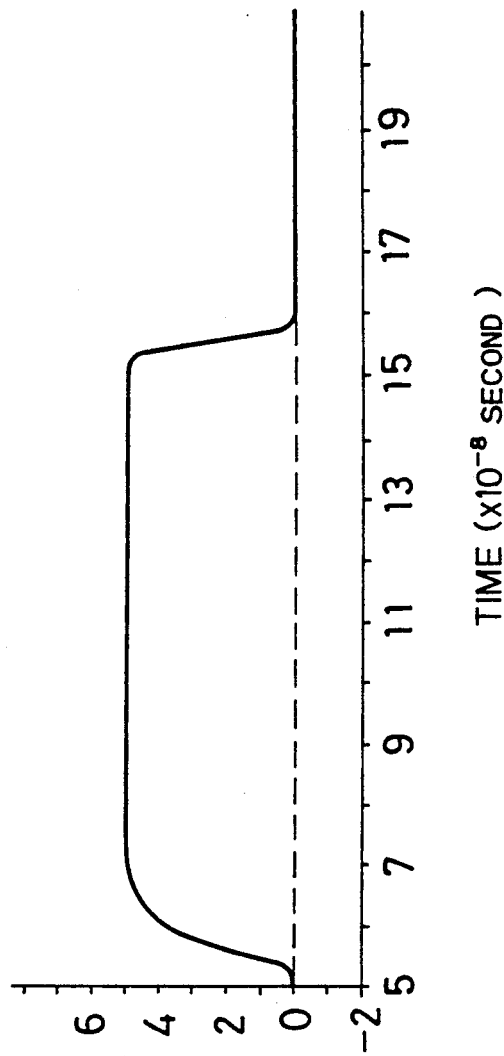
FIG. 9 illustrates the effect of the third preferred embodiment.

The operations of the output circuits K41 and K62 of FIG. 7 are shown in FIG. 8, which are complementary to the operations of FIG. 2. The current drive capability changes in sequential order from (A) to (D) with the increase in the output potential $V_O$. The overshoot OS in the output waveform is reduced by the effects similar to the first preferred embodiment. The provision of the output circuits K31, K41, K52 and K62 enables both overshoot OS and undershoot US to be suppressed in the output waveform as shown in FIG. 9.

Since the output circuits K31 and K41 are thus connected to the power sources $V_{SS}$ and $V_{DD}$ respectively, the third preferred embodiment has further effects as compared with the first and second preferred embodiments.

Figure 10:
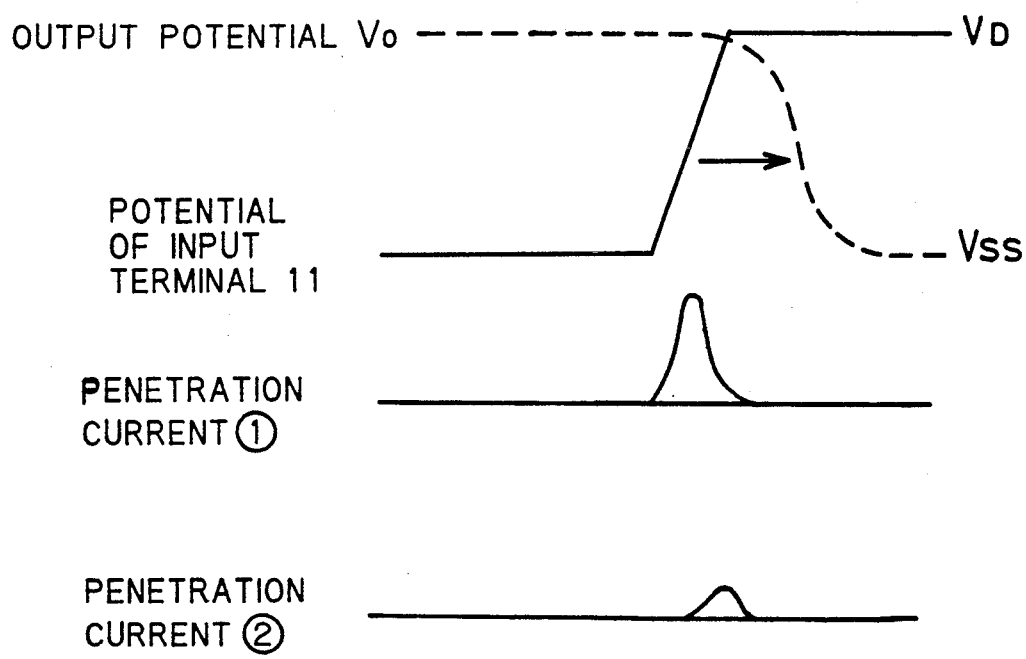
FIG. 10 illustrates a penetration current.

The solid waveform of FIG. 10 indicates the potential of the input terminal 11 changing from the potential $V_{SS}$ to the potential $V_{DD}$ In practice, the potential do not changes in the form of an ideal step but in the form of a ramp.

In the conventional output circuit shown in FIG. 14, the gates of the transistors 1P and 1N are connected to the input terminal 11 in common. In some cases, the transistors 1P and 1N are on at the same time. A penetration current ① shown in FIG. 10 flows in the transistors 1P and 1N, so that power is consumed more than necessary.

In the output circuits K31 and K41 shown in FIG. 7, the output potential $V_O$ (indicated by the broken waveform of FIG. 10) changes with delay after the potential of the input terminal 11 changes. Since the output potential $V_O$ drives the transistors 2N and 2P, the time period in which current flows through both of the transistors 1P and 2P (as well, through both of the transistors 1N and 2N) is short. Hence, a penetration current ② flowing though the transistors 1N, 2N, 1P, 2P is slight as shown in FIG. 10. That is, power is prevented from being consumed more than necessary.

Figure 11:
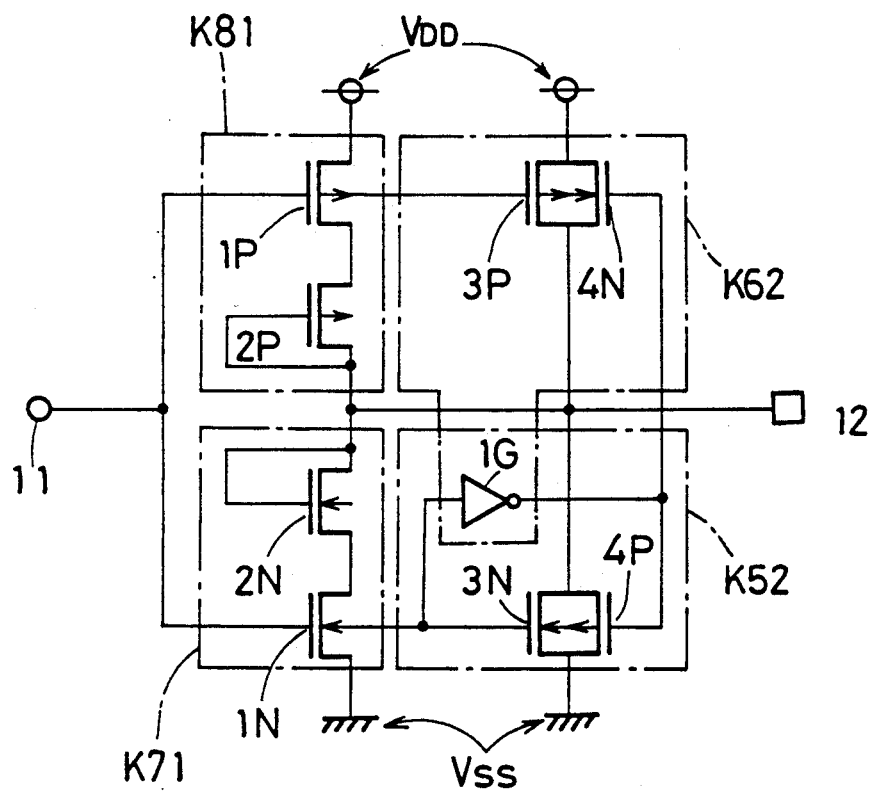
FIG. 11 is a circuit diagram of a fourth preferred embodiment according to the present invention.

FIG. 11 is a circuit diagram of a fourth preferred embodiment according to the present invention. In the fourth preferred embodiment, output circuits K71 and K81 are substituted for the output circuits K31 and K41 of the third preferred embodiment, respectively.

The output circuit K71 includes N channel MOS transistors 1N and 2N. The gate and source of the transistor 1N are connected to the input terminal 11 and the power source $V_{SS}$, respectively. The source of the transistor 2N is connected to the drain of the transistor 1N. The gate thereof is connected to the drain thereof and to the output terminal 12. The output circuit K81 is formed complementarily to the output circuit K71, and includes P channel MOS transistors 1P and 2P. The gate and source of the transistor 1P are connected to the input terminal 11 and the power source $V_{DD}$, respectively. The source of the transistor 2P is connected to the drain of the transistor 1P. The gate thereof is connected to the drain thereof and to the output terminal 12.

The transistors 1N and 2N of the output circuit K71, which are connected in series between the power source $V_{SS}$ and the output terminal 12, are in transposed relation to the transistors 1N and 2N of the output circuit K31 of the third preferred embodiment. The operation of the output circuit K71 is equivalent to that of the output circuit K31. Similarly, the operation of the output circuit K81 is equivalent to that of the output circuit K41 of the third preferred embodiment. Therefore, the fourth preferred embodiment is effectively similar to the third preferred embodiment.

Figure 12:
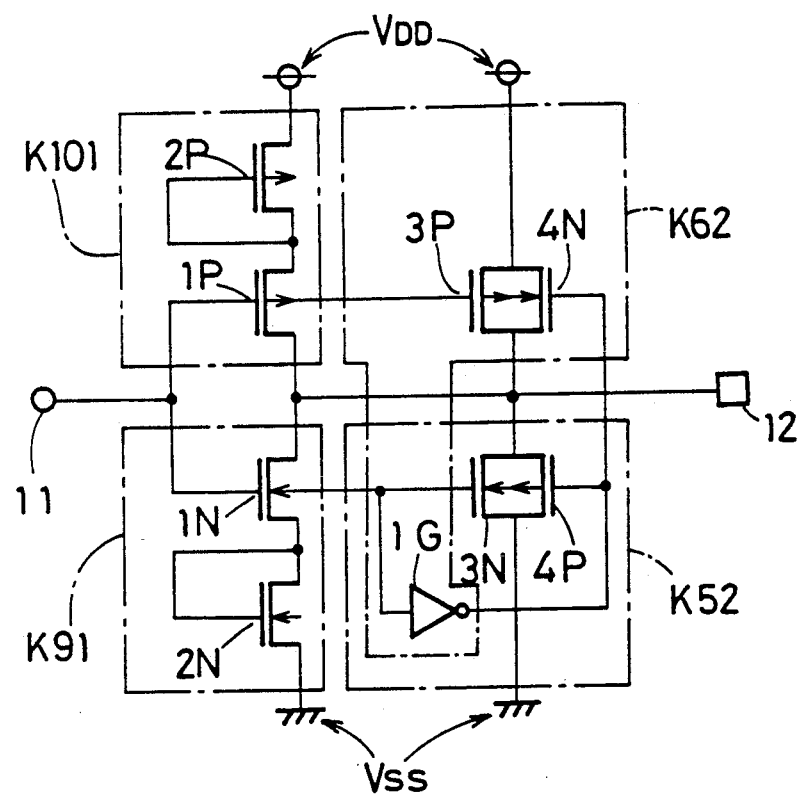
FIG. 12 is a circuit diagram of a fifth preferred embodiment according to the present invention.

FIG. 12 is a circuit diagram of a fifth preferred embodiment according to the present invention. The output circuits K31 and K41 in the third preferred embodiment are replaced with output circuits K91 and K101 in the fifth preferred embodiment, respectively.

The output circuit K91 includes N channel MOS transistors 1N and 2N. The gate and drain of the transistor 1N are connected to the input terminal 11 and the output terminal 12, respectively. The source of the transistor 2N is connected to the power source $V_{SS}$. The gate thereof is connected to the drain thereof and to the source of the transistor 1N.

The output circuit K101 is formed complementarily to the output circuit K91, and includes P channel MOS transistors 1P and 2P. The gate and drain of the transistor 1P are connected to the input terminal and the output terminal 12, respectively. The source of the transistor 2P is connected to the power source $V_{DD}$. The gate thereof is connected to the drain thereof and to the source of the transistor 1P.

In the output circuit K91, when the transistor 1N is on, the output potential $V_O$ is applied to the gate of the transistor 2N, so that the output circuit K91 operates in the same manner as the output circuit K31 of the third preferred embodiment. When the transistor 1N is off, the operation of the transistor 2N does not exert an influence on the output potential $V_O$. As a result, the output circuit K91 has the same effect as the output circuit K31.

The output circuit K101 has the same effect as the output circuit K41 of the third preferred embodiment, so that the fifth preferred embodiment is effectively similar to the third preferred embodiment.

Figure 13:
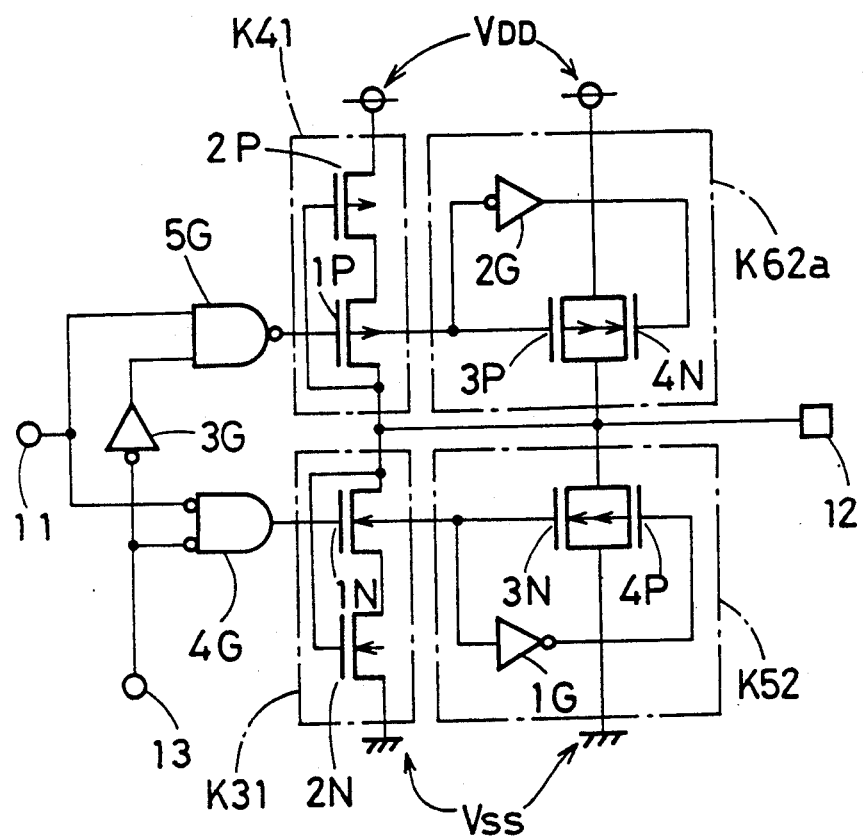
FIG. 13 is a circuit diagram of a sixth preferred embodiment according to the present invention.

FIG. 13 shows a three-state type inverter circuit according to a sixth preferred embodiment of the present invention. The circuit of FIG. 13 has the same structure as the output circuit of the third preferred embodiment shown in FIG. 7 except that a signal from an input terminal 13 controls the signal from the input terminal 11 by using inverter 3G and gates 4G, 5G in the sixth preferred embodiment. Since an output circuit K62a cannot share the inverter 1G with the output circuit K52, the output circuit K62a includes an inverter 2G.

When the input terminal 13 is at the logical level "L", the logical level of the input terminal 11 is inverted by the gates 4G, 5G, and is inputted to the output circuits K31, K41, respectively. Subsequently, ringing is suppressed in the same manner as in the third preferred embodiment, except that the potential at the same logical level as that of the input terminal 11 is outputted to the output terminal 12 in the sixth preferred embodiment.

When the input terminal 13 is at the logical level "H", the gates 4G, 5G are off, so that the transistors 1P and 1N turn off, irrespective of the logical level of the input terminal 11. The potential of the output terminal 12 turns into a "third state", that is, a high impedance state.

Thus the present invention can suppress ringing in the waveforms of the output terminals in various output circuits.

While the invention has been shown and described in detail, the foregoing description is in all aspects illustrative and not restrictive. It is therefore understood that numerous modifications and variations can be devised without departing from the scope of the invention.

What is claimed is:

1. An output circuit, comprising:
   an input terminal for receiving an input signal;
   an output terminal for outputting an output signal conducting a first change form a first logical level to a second logical level and a second change from said second logical level to said first logical level;
   a first power source having said first logical level; and
   a first output drive circuit connected between said output terminal and said first power source and controlled by said input signal for deriving said output signal having a logical level corresponding to said input signal from said output terminal;
   wherein, in said second change in the level of said output signal, said first output drive circuit has
   a current drive capability of relatively large dependence on said second change in a region in which the level of said output signal is around said second logical level, and
   a current drive capability of relatively small dependence on said second change in a region in which the level of said output signal is around said first logical level,
   the current drive capability of said output circuit being decreased monotonically with said second change;
   wherein said first output drive circuit comprises:
   a first output circuit connected between said output terminal and said first power source and controlled by said input signal, the current drive capability of said first output circuit being decreased monotonically at a relatively large decrease rate with said second change and becoming zero before the level of said output signal reaches said first logical level, and
   a second output circuit connected to said first output circuit in parallel and controlled by said input signal, the current drive capability of said second output circuit being decreased monotonically at a relatively small decrease rate with said second change and becoming zero when the level of said output signal reaches said first logical level.

2. An output circuit in accordance with claim 1, wherein said first output circuit includes
   first and second transistors each having a control gate and first and second current electrodes,
   said first and second transistors being connected in series with first and second current electrodes thereof between said output terminal and said first power source,
   said control electrode of said first transistor being connected to said input terminal,
   said control electrode of said second transistor being connected to one of said first current electrodes.

3. An output circuit in accordance with claim 2, wherein said first current electrode of said first transistor is connected to said output terminal,
   said first and second current electrodes of said second transistor are connected to said second current electrode of said first transistor and said first power source, respectively, and,
   said control electrode of said second transistor is connected to said first current electrode of said first transistor.

4. An output circuit, comprising:
   an input terminal for receiving an input signal;

an output terminal for outputting an output signal conducting a first change form a first logical level to a second logical level and a second change from said second logical level to said first logical level;

a first power source having said first logical level; and a first output drive circuit connected between said output terminal and said first power source and controlled by said input signal for deriving said output signal having a logical level corresponding to said input signal from said output terminal;

wherein, in said second change in the level of said output signal, said first output drive circuit has a current drive capability of relatively large dependence on said second change in a region in which the level of said output signal is around said second logical level, and a current drive capability of relatively small dependence on said second change in a region in which the level of said output signal is around said first logical level, the current drive capability of said output circuit being decreased monotonically with said second change;

wherein said first output drive circuit comprises:

a first output circuit connected between said output terminal and said first power source and controlled by said input signal, the current drive capability of said first output circuit being decreased monotonically at a relatively large decrease rate with said second change and becoming zero before the level of said output signal reaches said first logical level, and a second output circuit connected to said first output circuit in parallel and controlled by said input signal, the current drive capability of said second output circuit being decreased monotonically at a relatively small decrease rate with said second change and becoming zero when the level of said output signal reaches said first logical level; and wherein said second output circuit comprises a semiconductor device having a control electrode connected to said input terminal, a first current electrode connected to said first power source, and a second current electrode connected to said output terminal.

5. An output circuit comprising:

an input terminal for receiving an input signal, an output terminal for outputting an output signal conducting a first change from a first logical level to a second logical level and a second change from said second logical level to said first logical level, a first power source having said first logical level, a first output drive circuit connected between said output terminal and said first power source and controlled by said input signal for deriving said output signal having a logical level corresponding to said input signal from said output terminal, wherein, in said second change in the level of said output signal, said first output drive circuit has a current drive capability of relatively large dependence on said second change in a region in which the level of said output signal is around said second logical level, and a current drive capability of relatively small dependence on said second change in a region in which the level of said output signal is around said first logical level, the current drive capability of said output circuit being decreased monotonically with said second change, a second power source having said second logical level, a second output drive circuit connected between said output terminal and said second power source and controlled by said input signal for deriving said output signal having a logical level corresponding to said input signal from said output terminal, wherein, in said first change in the level of said output signal, said second output drive circuit has a current drive capability of relatively large dependence on said first change in the region in which the level of said output signal is around said first logical level, and a current drive capability of relatively small dependence on said first change in the region in which the level of said output signal is around said second logical level, the current drive capability of said output circuit being decreased monotonically with said first change.

6. An output circuit in accordance with claim 5, wherein said second output drive circuit includes:

a third output circuit connected between said output terminal and said second power source and controlled by said input signal, the current drive capability of said third output circuit being decreased monotonically at a relatively large decrease rate with said first change and becoming zero before the level of said output signal reaches said second logical level, and a fourth output circuit connected to said third output circuit in parallel and controlled by said input signal, the current drive capability of said fourth output circuit being decreased monotonically at a relatively small decrease rate with said first change and becoming zero when the level of said output signal reaches said second logical level.

7. An output circuit in accordance with claim 6, wherein said third output circuit includes fifth and sixth transistors each having a control gate and first and second current electrodes, said fifth and sixth transistors are connected in series with first and second current electrodes thereof between said output terminal and said second power source, said control electrode of said fifth transistor is connected to said input terminal, said control electrode of said sixth transistor is connected to one of said first current electrodes.

8. An output circuit in accordance with claim 7, wherein said first current electrode of said fifth transistor is connected to said output terminal, said first and second current electrodes of said sixth transistor are connected to said second current electrode of said fifth transistor and said second power source, respectively, and said control electrode of said sixth transistor is connected to said first current electrode of said fifth transistor.

9. An output circuit in accordance with claim 7, wherein said second current electrode of said fifth transistor is connected to said second power source, said first and second current electrodes of said sixth transistor are connected to said output terminal and said first current electrode of said fifth transistor, respectively, and said control electrode of said sixth transistor is connected to said first current electrode thereof.

10. An output circuit in accordance with claim 7, wherein said first current electrode of said fifth transistor is connected to said output terminal,
said first and second current electrodes of said sixth transistor are connected to said second current electrode of said fifth transistor and said second power source, respectively, and
said control electrode of said sixth transistor is connected to said first current electrode thereof.

11. An output circuit in accordance with claim 6, wherein said fourth output circuit includes
a semiconductor device having a control electrode connected to said input terminal, a first current electrode connected to said second power source, and a second current electrode connected to said output terminal.

12. An output circuit in accordance with claim 11, wherein said fourth output circuit further includes
a second inverter having an output portion and an input portion connected to said input terminal and
a second transmission gate connected between said output terminal and said second power source,
said second transmission gate being composed of
a seventh transistor having a control electrode connected to said input terminal, a first current electrode connected to said output terminal, and a second current electrode connected to said second power source, and
an eighth transistor having a control electrode connected to said output portion of said second inverter, a first current electrode connected to said output terminal, and a second current electrode connected to said second power source, the polarity of said eighth transistor being complementary to that of said seventh transistor.

13. An output circuit in accordance with claim 12, wherein said second transmission gate has an on resistance which is set between one-half and twice the characteristic impedance of a load connected to said output terminal.

14. An output circuit comprising:
an input transistor for receiving an input signal;
an output transistor for outputting an output signal conducting a first change from a first logical level to a second logical level and a second change from said second logical level to said first logical level;
a first power source having said first logical level;
a first output drive circuit connected between said output terminal and said first power source and controlled by said input signal for deriving said output signal having a logical level corresponding to said input signal from said output terminal;
wherein, in said second change in the level of said output signal, said first output drive circuit has
a current drive capability of relatively large dependence on said second change in a region in which the level of said output signal is around said second logical level, and
a current drive capability of relatively small dependence on said second change in a region in which the level of said output signal is around said first logical level,
the current drive capability of said output circuit being decreased monotonically with said second change;
wherein said first output drive circuit comprises:
a first output circuit connected between said output terminal and said first power source and controlled by said input signal, the current drive capability of said first output circuit being decreased monotonically at a relatively large decrease rate with said second change and becoming zero before the level of said output signal reaches said first logical level, and
a second output circuit connected to said first output circuit in parallel and controlled by said input signal, the current drive capability of said second output circuit being decreased monotonically at a relatively small decrease rate with said second change and becoming zero when the level of said output signal reaches said first logical level;
first and second transistors each having a control gate and first and second current electrodes,
said first and second transistors being connected in series with first and second current electrodes thereof between said output terminal and said first power source,
said control electrode of said first transistor being connected to said input terminal,
said control electrode of said second transistor being connected to one of said first current electrodes,
wherein said second current electrode of said first transistor is connected to said first power source,
said first and second current electrodes of said second transistor are connected to said output terminal and said first current electrode of said first transistor, respectively, and
said control electrode of said second transistor is connected to said first current electrode thereof.

15. An output circuit comprising:
an input terminal for receiving an input signal;
an output terminal for outputting an output signal conducting a first change from a first logical level to a second logical level and a second change from said second logical level to said first logical level;
a first power source having said first logical level;
a first output drive circuit connected between said output terminal and said first power source and controlled by said input signal for deriving said output signal having a logical level corresponding to said input signal from said output terminal;
wherein, in said second change in the level of said output signal, said first output drive circuit has
a current drive capability of relatively large dependence on said second change in a region in which the level of said output signal is around said second logical level, and
a current drive capability of relatively small dependence on said second change in a region in which the level of said output signal is around said first logical level,
the current drive capability of said output circuit being decreased monotonically with said second change;
wherein said first output drive circuit comprises:
a first output circuit connected between said output terminal and said first power source and controlled by said input signal, the current drive capability of said first output circuit being decreased monotonically at a relatively large decrease rate with said second change and becoming zero before the level of said output signal reaches said first logical level, and a current drive capability of relatively large dependence on said second change in a region in which the level of said output signal is around said second logical level, and a current drive capability of relatively small dependence on said second change in a region in which the level of said output signal is around said first logical level, the current drive capability of said output circuit being decreased monotonically with said second change;

first and second transistors each having a control gate and first and second current electrodes, said first and second transistors being connected in series with first and second current electrodes thereof between said output terminal and said first power source, said control electrode of said first transistor being connected to said input terminal, said control electrode of said second transistor being connected to one of said first current electrodes, wherein said first current electrode of said first transistor is connected to said output terminal, said first and second current electrodes of said second transistor are connected to said second current electrode of said first transistor and said first power source, respectively, and said control electrode of said second transistor is connected to said first current electrode thereof.

16. An output circuit comprising:

an input terminal for receiving an input signal;

an output terminal for outputting an output signal conducting a first change from a first logical level to a second logical level and a second change from said second logical level to said first logical level;

a first power source having said first logical level;

a first output drive circuit connected between said output terminal and said first power source and controlled by said input signal for deriving said output signal having a logical level corresponding to said input signal from said output terminal;

wherein, in said second change in the level of said output signal, said first output drive circuit has a current drive capability of relatively large dependence on said second change in a region in which the level of said output signal is around second logical level, and a current drive capability of relatively small dependence on said second change in a region in which the level of said output signal is around said first logical level, the current drive capability of said output circuit being decreased monotonically with said second change;

wherein said first output drive circuit comprises:

a first output circuit connected between said output terminal and said fist power source and controlled by said input signal, the current drive capability of said first output circuit being decreased monotonically at a relatively large decrease rate with said second change and becoming zero before the level of said output signal reaches said first logical level, and a second output circuit connected to said first output circuit in parallel and controlled by said input signal, the current drive capability of said second output circuit being decreased monotonically at a relatively small decrease rate with said second change and becoming zero when the level of said output signal reaches said first logical level; wherein said second output circuit comprises:

a semiconductor device having a control electrode connected to said input terminal, a first current electrode connected to said first power source, and a second current electrode connected to said output terminal, a first inverter having an output portion and an input portion connected to said input terminal and a first transmission gate connected between said output terminal and said first power source, said first transmission gate being composed of a third transistor having a control electrode connected to said input terminal, a first current electrode connected to said output terminal, and a second current electrode connected to said first power source, and a fourth transistor having a control electrode connected to the output portion of said first inverter, a first current electrode connected to said output terminal, and a second current electrode connected to said first power source, the polarity of said fourth transistor being complementary to that of said third transistor.

17. An output circuit in accordance with claim 16, wherein said first transmission gate has an on resistance which is set between one-half and twice the characteristic impedance of a load connected to said output terminal.

* * * * *